United States Patent [19]

Cheng et al.

[11] Patent Number: 5,008,215
[45] Date of Patent: Apr. 16, 1991

[54] PROCESS FOR PREPARING HIGH SENSITIVITY SEMICONDUCTIVE MAGNETORESISTANCE ELEMENT

[75] Inventors: Duen J. Cheng; Guey F. Chi; Ying C. Yeh, all of Chutung, Taiwan

[73] Assignee: Industrial Technology Research Institute, Hsinchu, Taiwan

[21] Appl. No.: 377,248

[22] Filed: Jul. 7, 1989

[51] Int. Cl.$^5$ .......................................... H01L 21/20
[52] U.S. Cl. ............................... 437/83; 148/DIG. 3; 148/DIG. 5; 148/DIG. 118; 148/DIG. 152; 156/603; 437/82; 437/247; 437/973
[58] Field of Search .................. 148/DIG. 3, DIG. 5, 148/15, 24, 25, 48, 60, 65, 71, 90, 97, 110, 118, 152, 154, 169, 33, 33.3; 156/610–614, 603, 604; 357/16, 17, 30; 427/248.1, 252, 255.1; 437/10, 12, 13, 81, 82, 83, 105, 107, 101, 108, 109, 112, 126, 133, 247, 936, 963, 973

[56] References Cited

U.S. PATENT DOCUMENTS

| | | | |
|---|---|---|---|
| 3,966,501 | 6/1976 | Namura et al. | 437/46 |
| 4,075,654 | 2/1978 | Hara et al. | 357/16 |
| 4,112,137 | 9/1978 | Zega | 427/38 |
| 4,139,401 | 2/1979 | McWilliams et al. | 437/109 |
| 4,280,854 | 7/1981 | Shibata et al. | 437/35 |
| 4,525,223 | 6/1985 | Tsuya et al. | 437/81 |
| 4,595,601 | 6/1986 | Horioka et al. | 437/239 |
| 4,605,565 | 8/1986 | Nath | 427/39 |
| 4,800,100 | 1/1989 | Hebots et al. | 427/38 |
| 4,851,358 | 7/1989 | Huber | 437/10 |

FOREIGN PATENT DOCUMENTS 2533097  3/1976  Fed. Rep. of Germany.

OTHER PUBLICATIONS

Gavrilin et al., ". . . Properties of the Dielectric Sublayer on SAW Application . . . ", Sov. Phys. Tech. Phys., vol. 27, No. 4, Apr. 1982, pp. 509–510.
Le Contellec et al., ". . . InSb Thin Films", Thin Solid Films, vol. 36, No. 1, Jul. 15, 1976, pp. 151–155.
Cheng et al., "Microstructures of . . . Indium Antimonide Thin Films", Mater. Res. Soc. Symp. Proc., vol. 135, 1989, pp. 477–482.

*Primary Examiner*—Olik Chaudhuri
*Assistant Examiner*—William Bunch
*Attorney, Agent, or Firm*—Scully, Scott, Murphy & Presser

[57] ABSTRACT

A process for preparing high sensitivity indium antimonide film magnetoresistance element. A silicon single crystal wafer is treated with oxidative diffusion to form a layer of silicon oxide on the surface of the silicon single crystal, a layer of indium antimonide is grown on the substrate by vapor deposition, and the indium antimonide layer is then subjected to a specific annealing treatment in which the indium antimonide layer is partially oxidized and then re-crystallized. The resultant magnetoresistance element possessing improved sensitivity, stability and suitable for large scale production is obtained.

6 Claims, 5 Drawing Sheets

PROCESS FOR PREPARING HIGH SENSITIVITY SEMICONDUCTIVE MAGNETORESISTANCE ELEMENT

BACKGROUND OF THE INVENTION

Semiconductive magnetoresistance (MR) element has the characteristics of high compactness, non-contact, high sensitivity, long useful life and having only two leads on the ends. Such characteristics render semiconductive magnetoresistance element highly desirable for applications in, for example, speed sensor, potential sensor, position sensor and graph identification sensor. Indium antimonide compound, having the highest electron mobility, is the most commonly used material for producing semiconductive magnetoresistance element.

Presently, commercialized magnetoresistance products are most commonly produced employing the technique developed by Weiss et al in which an indium antimonide/nickel antimonide two phase single crystal is used as the magnetoresistance material. However, the intolerable high costs of the growth of indium antimonide single crystal and the accompanied grinding and polishing processes render its industrial applications impractical. Facing the deficiency, extensive research has been devoted to the development of indium antimonide film as a substitute for conventional indium antimonide single crystal. However, in the production of indium antimonide film, antimony tends to diffuse and evaporate from indium antimonide film and thus deteriorate the quality of the thus produced indium antimonide film. It is therefore still an issue to produce indium antimonide film having properties and sensitivity competitive with those of indium antimonide single crystal.

Excellent magnetoresistance elements are characterized by high electron mobility and well designed short circuit electrodes which are essential for obtaining high resistance variation due to the presence of magnetic field. To obtain a magnetoresistance element of high sensitivity, it is necessary to add external Hall voltage short circuit electrodes or, as a substitute for the external Hall voltage short circuit electrodes, introducing a second phase of needle-like precipitates having metallic conductivity. This adds further complexity to the production of magnetoresistance elements. A satisfactory process for producing high sensitivity magnetoresistance element has always been lacking.

The basics and drawbacks of the common processes for producing magnetoresistance element from indium antimonide single crystal and from indium antimonide film are described below.

With respect to the production of magnetoresistance element from indium antimonide single crystal, an indium antimonide single crystal wafer is grounded until a thickness below 50 μm is obtained and then etched to impart the desired pattern. To obtain a high sensitivity indium antimonide single crystal with high $R_B/R_o$ (the ratio of resistance value in the field to that in zero field) value, Hall voltage short circuit electrodes are often externally electroplated or evaporated to the pattern. In other cases the co-precipitation properties of indium antimonide and nickel antimonide are utilized that needle-like nickel antimonide is precipitated from the indium antimonide base in the production of indium antimonide single crystal as a substitute for the external Hall voltage short circuit electrodes. The techniques suffer primarily from the high costs of indium antimonide single crystal and the accompanied grinding and polishing of the crystal. Besides, large amount of materials is wasted during the grounding operation. On the other hand, it is very difficult to control the spatial uniformity of the needle-like precipitation of nickel antimonide in the Czchralski growth for the production of indium antimonide/nickel antimonide single crystal. As a result, the nickel antimonide precipitates will not disperse evenly or even emerge as aggregates, rendering the properties of the thus produced magnetoresistance element highly unidentical.

With respect to the production of magnetoresistance elements from indium antimonide film, different deposition ratios for indium, antimony or indium antimonide are controlled during the deposition process. A stepwise vapor deposition and an additional step of heat treatment are employed to ensure the high quality of the obtained indium antimonide film. The resultant indium antimonide film is then etched on with a circuit pattern. To improve the magnetoresistance value of the indium antimonide film element, short circuit electrodes are externally added or indium is devised to be precipitated within the indium antimonide film. The heat treatment for indium antimonide film commonly includes microzone melting or annealing. In the heat treatment of indium antimonide film, antimony is easily evaporated and as a result the composition and distribution of indium and antimony in the resultant indium antimonide film is frequently affected. To prevent the deterioration caused by the re-evaporation of antimony, an oxide layer is frequently covered on the indium antimonide film as a protective layer. In addition to the prevention of the re-evaporation of antimony, the protective layer is also considered effective for the prevention of the island-like indium aggregation caused by the surface tension of the melted surface in the microzone melting process. Due to poor adhesion caused by poor compatibility between the indium antimonide and the protective layer, the protective layer is easily damaged during the heat treatment, especially when the heat treatment temperature exceeds the melting point of indium antimonide. This further deteriorates the surface properties of indium antimonide and becomes an obstacle to the grain growth during re-crystallization. It is therefore unsatisfactory to prevent the re-evaporation of antimony by applying an oxide layer on the surface of indium antimonide film and a satisfactory process for producing indium antimonide film for magnetoresistance element is still lacking.

The sensitivity of indium antimonide film element can be improved by precipitating metallic short circuit electrode or short-circuiting the Hall voltage thereof to enhance the magnetoresistance resistance effect of the element in a magnetic field. However, as described above, the prior techniques employing stepwise film growth and microzone melting treatment fail to obtain satisfactory product. The precipitation of indium is usually uneven or emerges as large particulate aggregations. Even distribution of needle-like precipitate of indium cannot be controlled. Furthermore, the operation is quite complex. These and other factors render their large scale implementation impractical.

SUMMARY OF THE INVENTION

It is therefore an object of the present invention to provide a simple and economical process for producing a magnetoresistance element having satisfactory sensitivity.

It is another object of the present invention to provide a simple and economical process for producing a magnetoresistance element having stable properties, especially in crystallinity and even distribution of needle-like indium precipitates.

It is another object of the present invention to provide a simple and economic process for producing a magnetoresistance element which is suitable for implementation in large scale.

Accordingly, the present invention provides a process for preparing high sensitivity indium antimonide film magnetoresistance element comprising:

(1) forming a layer of silicon oxide on the surface of a silicon single crystal wafer by oxidizing the surface of the wafer under elevated temperature;

(2) growing a layer of indium antimonide film on the surface of the layer of silicon oxide, thé indium to antimony weight ratio in the layer of indium antimonide film being from 0.8 to 2.0, and (3) annealing the layer of indium antimonide film by a two stage annealing treatment comprising a first stage carried out under a first protective atmosphere containing from 1 to 5 weight percent of oxygen and a second stage carried out under a second protective atmosphere containing essentially no oxygen, whereby a protective oxide layer is formed on the surface of the layer of indium antimonide film and evenly distributed fine indium needle-like indium precipitates are formed within the layer of indium antimonide film.

The essentials for the individual elements are described below.

DETAILED DESCRIPTION OF THE INVENTION

The process of the present invention comprises primarily three stages, namely, substrate treatment, indium antimonide film growth and indium antimonide film heat treatment. A silicon single crystal wafer is treated with oxidative diffusion, a layer of indium antimonide film is grown on the substrate by vapor deposition, and the indium antimonide film is then partially oxidized and re-crystallized in a heat treatment stage. All these stages play important roles in obtaining high sensitivity indium antimonide film. High performance indium antimonide film can be obtained only when the three stages are well controlled. The contents and characteristics of these stages will be illustrated below.

SUBSTRATE TREATMENT

In the past, materials frequently adopted for use as the substrate for growing indium antimonide film are mainly indium antimonide single crystal, GaAs single crystal, silicon single crystal, alumina, mica, glass, etc. Indium antimonide single crystal and GaAs single crystal are too expensive. Alumina and glass are not easily processed for good surface finishness and thus are not suitable for the manufacture of thin substrate elements. Mica requires delicate processing and thus is not suitable for mass production. Thus, from the standpoints of cost, processing technique or manufacture, silicon single crystal is contemplated as the most preferred substrate for growing indium antimonide film. However, if indium antimonide film is grown directly on silicon single crystal, it will be found that indium antimonide film tends to peel off in the subsequent stage of heat treatment and, furthermore, the result of re-crystallization accompanying the heat treatment is observed to be poor. In view of the deficiency, a layer of silicon oxide is formed according to the present invention on the surface of the silicon single crystal as an interface for securing the silicon substrate and the indium antimonide film. The layer of silicon oxide is formed by oxidative diffusion of oxygen on the surface of the silicon single crystal under elevated temperature. The oxidation is preferably carried out under an oxidizing atmosphere containing oxygen and steam (wet oxidization) at a temperature preferably from 950° to 1050° C. for a duration preferably from 30 to 180 minutes. The thickness of the silicon oxide layer is from about 1,000 to about 10,000Å. The silicon oxide layer is found to be amorphous and possess the following advantages:

(1) The oxidative diffusion of silicon has been quite standardized and does not comprise any technical difficulty. There is no compatibility problem between silicon substrate and silicon oxide layer and thus interface destruction will not occur.

Figure 1:
FIG. 1 is a transmission electron microscope (TEM) cross sectional view of the magnetoresistance element of the present invention showing the interconnection of indium antimonide film with the substrate.

(2) The adherence of indium antimonide film on the treated substrate will be greatly improved. As shown by FIG. 1, if a layer of indium antimonide film is grown on the resultant substrate and then subjected to a heat treatment, the interaction between the indium antimonide film and the silicon oxide layer will further improve their adherence. Without bound to any theory, it is considered that the indium element in the indium antimonide layer may possibly interact with the oxygen in silicon oxide layer and forms indium oxide.

(3) indium antimonide film grown on the silicon/silicon oxide substrate will possess nearly perfect crystallinity after annealing treatment.

(4) Silicon oxide is an effective insulating material and thus electrical leakage will not be observed even when cheap silicon substrate of low resistance is used.

GROWTH OF INDIUM ANTIMONIDE FILM

The growth of indium antimonide film is preferably carried out by vapor deposition of indium, antimony or indium antimonide under vacuum onto the substrate. Factors correlated with the growth of film, in addition to the properties of the substrate, are primarily the temperature of the substrate and the composition of the indium antimonide film. According to the present invention, the temperature of the substrate is preferably from 300° to 400° C. If the temperature of the substrate is lower than 300° C., the crystallinity of the resultant indium antimonide film will be adversely affected and the properties of the film during the subsequent annealing stage will be greatly deteriorated. If the temperature of the substrate exceeds 400° C., the re-evaporation of indium and antimony will occur, resulting in a waste of material and uneven surface conditions of the resultant indium antimonide film. The composition of resultant indium antimonide film is a function of growth rates of indium and antimony and the conditions of the subsequent annealing. With vapor deposition technique, the indium to antimony weight ratio is controlled according to the present invention to be from 0.8 to 2.0 which is preferred for the re-crystallization during the subsequent heat treatment stage. The indium antimonide film produced according to the present invention will then have high sensitivity (as a result of good crystallinity with needle-like precipitates of indium) and even surface condition.

HEAT TREATMENT OF INDIUM ANTIMONIDE FILM

Indium antimonide is easily decomposed and oxidized under elevated temperature. It has been sought after to find a heat treatment technique for completely re-crystalizing indium antimonide and at the same time precipitating indium as the short circuit electrodes without severe decomposition and oxidation. In conventional processes, an oxide layer is frequently imparted as a protective layer on the surface of indium antimonide film during the heat treatment. However, due to the surface coercive force of the indium antimonide surface and the difference in heat expansion coefficient, the coated layer is frequently easily damaged. Notwithstanding the operations are complex, the results are poor. According to the present invention, a two stage annealing treatment is adopted. The indium antimonide film is first oxidized in a nitrogen atmosphere containing from 1 to 5 weight percent of oxygen at from 250° to 350° C. for about 30 seconds to 2 minutes such that a layer of indium oxide of thickness about 1000Å is obtained on the surface of the indium antimonide film. As shown by FIG. 2, antimony diffuses to the surface and evaporates during the first stage of oxidation and the residual surface indium forms a layer of indium oxide through reaction with oxygen which has diffused into to film. The indium oxide layer thus formed hinders any further diffusion and evaporation of antimony from within the film at this and subsequent stages The resultant indium antimonide film is then transferred to a completely protective atmosphere to undergo re-crystallization treatment under 500° to 540° C. for from 1 to 30 minutes. The time required for the heat treatment depends on the temperature, the composition of the indium antimonide film and other conditions. During the re-crystallization step, indium antimonide re-crystallizes and excess indium precipitates as needle-like precipitates which are evenly distributed throughout the indium antimonide film, as shown by FIG. 2. The annealing treatment has the following advantages:

(1) Since the volatility of antimony is much higher than that of indium, surface antimony begins to evaporate at around 300° C. and residual indium forms indium oxide with the oxygen that has diffused into the film. Such indium oxide layer, as contrasted with conventional protective layer, possesses high compatibility with the indium antimonide film and thus will not be deteriorated at subsequent stages of processing.

(2) In the re-crystallization treatment, the indium in excess to antimony will locally diffuse to neighboring aggregates of indium and, as in other conventional second phase precipitation, forms needle-like precipitates which are distributed throughout the indium antimonide film. These tiny needle-like voltage and result in high resistance value in a magnetic field and the sensitivity of the indium antimonide film is thereby improved.

(3) Since the vacuum deposition and the annealing treatment can be connected consecutively in a production line, the process of the present invention is suitable for large scale production.

Following the annealing treatment, the resultant product is allowed to cool down to room temperature under a protective atmosphere. An indium antimonide magnetoresistance element having high sensitivity, high stability and suitable for large scale production is thus obtained.

The present invention will be further illustrated with the following non-limiting example.

EXAMPLE

1. Substrate Treatment

A commercialized silicon wafer of resistivity value between 1 and 20 ohm-cm was cleaned by conventional method and then wet-oxidized at 1000° C. for 60 minutes.

2. Indium-Antimony Film Growth

Indium and antimony of purities both higher than 99.99 wt% were vapor-deposited by a two-source vacuum evaporator onto the substrate while the substrate was rotated. A thickness controller was used to control the growth rate and film thickness of the resultant film. The operational conditions were as follows Temperature of the substrate: 400° C.
Pressure of the deposition chamber: $3 \times 10^{-6}$ torr
Deposition rate of indium: 15 A/sec
Deposition rate of antimony: 22 A/sec
Thickness of indium antimonide film: 3 $\mu$m The resultant indium antimonide film possessed a electron mobility of 1200 cm$^2$/V.sec.

3. Annealing Treatment

The indium antimonide coated substrate was then moved to a two-stage annealing furnace. A first stage annealing was carried out at 300° C. in a nitrogen atmosphere containing 5 wt% of oxygen for 1 minute. A second stage annealing was then carried out at 545° C. in a nitrogen atmosphere containing no oxygen for 20 minutes. After cooling to room temperature, a magnetoresitance element in accordance with the present invention was obtained.

Figure 2A:
FIGS. 2a and 2b are TEM cross sectional views of the magnetoresistance element of the present invention showing the microstructure of indium antimonide film after heat treatment.
Figure 2B:
Figure 3A:
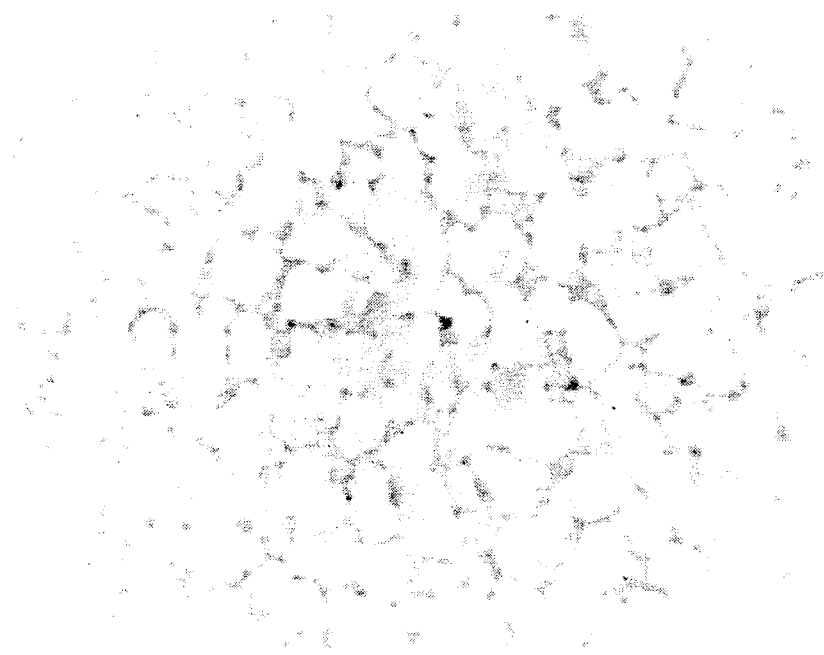
FIGS. 3a and 3b are scanning electron microscope (SEM) picture showing the surface morphology and cross sectional morphology of the indium antimonide film after annealing.
Figure 3B:

The resultant indium antimonide film possessed an electron mobility higher than 40,000 cm$^2$/V.sec. As shown by FIGS. 3a and 3b which are the results of a survey by scanning electron microscope (SEM) on the surface and the cross section of the indium antimonide film, the average grain size of the re-crystallized indium antimonide is larger than 2 um. This shows that the indium antimonide crystals are grown nearly perfectly. FIGS. 2a and 2b show that tiny needle-like precipitates of indium are distributed evenly throughout the indium antimonide film. Particularly, FIG. 2b shows that indium antimonide are re-crystallized like a single crystal. FIG. 1 shows the mutual diffusion of indium antimonide, silicon and silicon oxide at their boundary which effectively improved their adherence.

We claim:

1. A process for preparing high sensitivity indium antimonide film magnetoresistance element comprising:

(1) forming a layer of silicon oxide on the surface of a silicon single crystal wafer by oxidizing the surface of said wafer under elevated temperature;

(2) growing a layer of indium antimonide film on the surface of said layer of silicon oxide, the indium to antimony weight ratio in said layer of indium antimonide film being from 0.8 to 2.0, and (3) annealing said layer of indium antimonide film by a two-stage annealing treatment comprising a first stage carried out in a first protective atmosphere containing from 1 to 5 weight percent of oxygen and a second stage carried out in a second protective atmosphere containing essentially no oxygen, whereby a protective oxide layer is formed on the surface of said layer of indium antimonide film and evenly distributed fine needle-like indium precipitates are formed within said layer of indium antimonide film.

2. A process as claimed in claim 1, wherein the thickness of said layer of silicon oxide is between 1,000 and 10,000 Å.

3. A process as claimed in claim 1 wherein the duration of the first stage of said annealing treatment is from 30 seconds to 2 minutes and the duration of the second stage of said annealing treatment is from 1 second to 30 minutes.

4. A process as claimed in claim 1, wherein the temperature of the first stage of said annealing treatment is from 300° to 400° C. and the temperature of the second stage of said annealing treatment is from 500° to 540° C.

5. A process as claimed in claim 1 wherein the thickness of said protective oxide layer is from 1000Å to 10000Å.

6. A process according to claim 1, wherein said layer of indium antimonide film is grown by vapor deposition.

* * * * *